(12) United States Patent
Motwani

(10) Patent No.: US 9,093,170 B2
(45) Date of Patent: Jul. 28, 2015

(54) MULTI-LEVEL CELL (MLC) NON-VOLATILE MEMORY DATA READING METHOD AND APPARATUS

(71) Applicant: Intel Corporation, Santa Clara, CA (US)

(72) Inventor: Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 335 days.

(21) Appl. No.: 13/782,821

(22) Filed: Mar. 1, 2013

(65) Prior Publication Data

US 2014/0247655 A1    Sep. 4, 2014

(51) Int. Cl.
*G11C 11/34* (2006.01)
*G11C 16/26* (2006.01)
*G11C 11/56* (2006.01)

(52) U.S. Cl.
CPC ............ *G11C 16/26* (2013.01); *G11C 11/5642* (2013.01)

(58) Field of Classification Search
CPC . G11C 16/3404; G11C 16/3409; G11C 16/11
USPC .............. 365/185.03, 189.14, 189.17, 189.15
See application file for complete search history.

(56) References Cited

U.S. PATENT DOCUMENTS 7,164,601 B2 *   1/2007   Mitani et al. .............. 365/185.03

* cited by examiner

*Primary Examiner* — Son Dinh
(74) *Attorney, Agent, or Firm* — Schwabe, Williamson & Wyatt, P.C.

(57) ABSTRACT

Embodiments include systems, methods, and apparatuses for reading the signal-level of three-signal-level cells in a non-volatile memory (NVM). In one embodiment, a receiver may be configured to receive a serial string of values and identify which values in the string are the results of a lower-page read or an upper-page read of the cells. In some embodiments, one signal-level of a three-signal level cell may be represented only by a value in the lower-page read of the cells, while a second signal-level of the three-signal level cell may be represented by a value in the lower-page read of the cells and an upper-page read of the cells.

20 Claims, 7 Drawing Sheets

MULTI-LEVEL CELL (MLC) NON-VOLATILE MEMORY DATA READING METHOD AND APPARATUS

FIELD

Embodiments of the present invention relate generally to the technical field of data storage devices. Specific embodiments include methods of reading information stored in cells of multi-level cell (MLC) non-volatile memory (NVM) where information may be stored in one of three signal-levels per MLC.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

A cell in an NVM may store information by setting the voltage of the cell to a signal-level voltage of the cell. A signal-levels may refer to the voltage that the cell is set to by a "writer" of the storage device comprising the NVM. For example, the voltage of the cell may be set to one of two possible signal-levels by the writer. If the cell only comprises two possible signal-levels, then the one-bit value of "0" may be stored in the cell by setting the cell to a first signal-level, and the one-bit value of "1" may be stored in the cell by setting the cell to a second signal-level. Similarly, if the cell of NVM is capable of storing information at one of four signal-levels, i.e., the cell is a cell of MLC NVM, then the first, second, third, and fourth signal-levels may respectively represent the two-bit values "00," "01," "10," and "11."

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
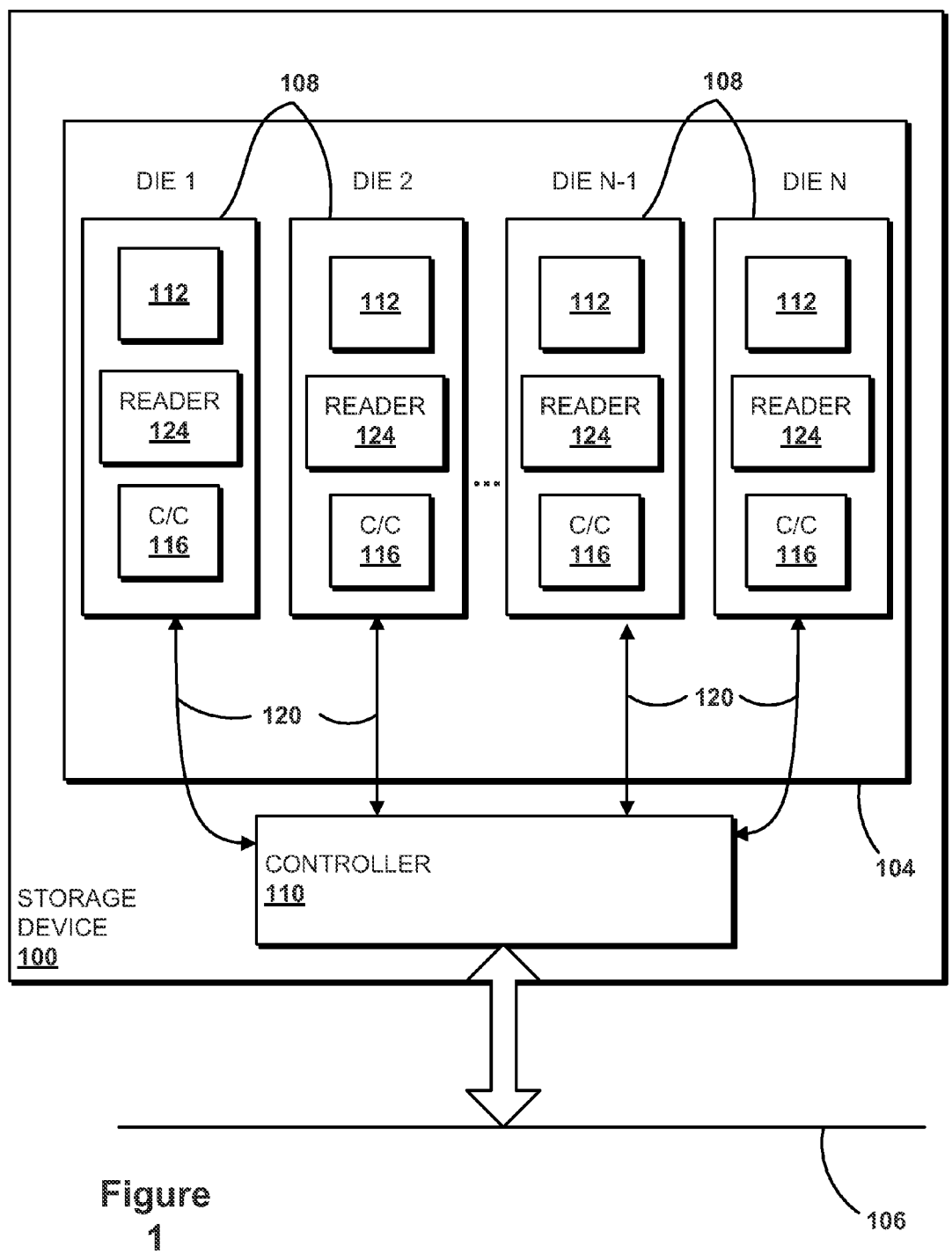
FIG. 1 illustrates an example storage drive storing data in die of NVM, in accordance with various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Apparatuses, methods, and storage media associated with multi-signal-level cells in MLC NVM are described herein. Specifically, one or more cells in the MLC NVM may be able to store information at one of three signal-levels. In some embodiments, the information may be split between a lower page and an upper page of the cells such that data from a lower page may be written into the first bit of cells and, subsequently, data from an upper page may be written into the second bit of the cells. A lower-page read of one or more cells of the MLC NVM may be performed to determine whether each cell is at signal-level "0" or signal-levels "1 or 2." An upper-page read of the one or more cells may then be performed to determine whether the cell is at signal-level "1" or signal-level "2." The results of the lower-page reads may be stored in a lower-page buffer, while the results of the upper-page reads may be stored in an upper-page buffer. Before transmission in a data stream, the results of the upper-page read may be gated based at least in part on the results of the lower-page read. This gating may result in one signal-level being represented in the data stream by a one-bit value, while another signal-level may be represented in the data stream by a two-bit value. By using different values for different signal-levels, transmission time and transmission overhead may be significantly reduced.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smartphone (which may include one or more processors), a tablet, laptop computer, a set-top box, a gaming console, and so forth.

With reference to FIG. 1, in various embodiments, a storage device 100, may include NVM 104. In embodiments, the NVM 104 may be MLC NVM that is at least partially including cells that are settable to more than two signal-levels. Information may be written to and/or read from NVM 104 at the direction of a controller 110, e.g., by way of one or more communication lines 120. In embodiments, the communication lines 120 may be a bus such as an Open NAND Flash Interface (ONFI) bus as specified, for example, in the ONFI 3.1 specifications published October of 2012. In other embodiments, the communication lines 120 may be a bus such as a serial advanced technology attachment (SATA) bus, a peripheral component interconnect (PCI) bus, a PCI Express (PCIe) bus, a serial attached small computer system interface (SAS) bus, a fibre channel (FC) bus, or some other type of bus. The read or write processes may be respectively performed by a reader 124 or writer (not shown) which may be separate from one another, or combined. In some embodiments, the reader 124 and the conversion/compression module 116 may be implemented as hardware, firmware, software, or some combination thereof.

Although not depicted, various other components may be coupled with storage device 100 via one or more communication lines 106, including but not limited to one or more central processing units (CPUs), volatile memory (e.g., dynamic random access memory, or DRAM), one or more input/output (I/O) devices, alternative processing units (e.g., graphics processors), and so forth. In various embodiments, storage device 100 may be a solid state drive (SSD) or hybrid hard drive (HHDD).

NVM 104 may come in various forms, including but not limited to NAND (flash) memory, ferroelectric random-access memory (FeTRAM), nanowire-based non-volatile memory, three-dimensional (3D) cross point memory such as phase change memory (PCM), memory that incorporates memristor technology, magnetoresistive random-access memory (MRAM), spin transfer torque (STT)-MRAM, and so forth. In many cases, including the example of FIG. 1, NVM 104 may include a plurality of die 108. For example, in FIG. 1, NVM 104 includes N die 108. N may be any positive integer. In other embodiments, NVM 104 may only include a single die 108. As shown in FIG. 1, each die 108 may have at least one cell 112 of memory, as will be explained in greater detail below. It will be understood that although one cell 112 is shown per die 108, each die may have a plurality of cells 112. Additionally, each die 108 does not necessarily have to have the same amount of cells 112 as another die 108. Finally, the data may be arranged in different groupings as described herein, for example the cells 112 may be arranged as blocks or pages of memory. In embodiments, the die 108 may include a conversion/compression module 116. The conversion/compression module 116 may be configured to convert and/or compress data corresponding to reads of the cells 112 by the reader 124. Specifically, the reader 124 may perform reads of the plurality of the cells 112 of the die 108 in parallel. The reader 124 may output the parallel data to the conversion/compression module 116 which may convert that parallel data into a serial stream which is output to the controller 110 on the communication lines 120. In embodiments, the conversion/compression module 116 may be considered part of the reader 124 discussed above, while in other embodiments, the conversion/compression module 116 may be considered to be separate from the reader 124.

Commonly, information may be stored in an NVM 104 in the plurality of cells 112. In some NVM 104, the cells 112 may store the information at one of two signal-levels. For example, if the cell 112 is set to a first signal-level by a writer, then the information stored in the cell 112 may be represented in a data stream by a single bit value of "0." Similarly, if the cell 112 is set to a second signal-level, then the information stored in the cell 112 may be represented in the data stream by a single bit value of "1." As noted above, other cells 112 may be settable to more than two signal-levels. For example, one or more cells 112 in the NVM 104 may be multi-level cells, and may be settable to one of four signal-levels. In these cells 112, if the cell 112 is set to a first signal-level, then the information stored by the cell 112 may be represented in a data stream by a two-bit value of "00." Similarly, the second, third, and fourth signal-levels of the cell 112 may be represented in a data stream by a two bit value of "01," "10," and "11," respectively.

In embodiments, three signal-levels may be employed to store data in at least some of cells 112, as described in further detail below. For example, one or more cells 112 in the NVM 104 may be configured to store a voltage at one of three distinct voltages (signal-levels), thus indicating the value stored by the cell 112. However, because a cell 112 may have a non-binary number of signal-levels, e.g. three, more than a single-bit value may be required to distinguish between the first, second, and third signal-level of the cell, but a two-bit value of the cell 112 may not be an efficient way to represent the value of the cell 112 in all cases. Therefore, these cells may be read using embodiments of the techniques of the present disclosure, to be described more fully below.

Typically, the signal-level of a cell such as cell 112 of NVM 104 may be read by a reader 124 by applying a read reference voltage to the cell 112. By applying the read reference voltage, the signal-level of the cell 112 may be determined by the reader 124 based on whether the cell 112 is set to a voltage which is higher or lower than the read reference voltage. For example, the cell 112 may be set to a relatively low voltage for a first signal-level, and the cell 112 may be set to a relatively high voltage for a second signal-level. A read reference voltage between the relatively low voltage and the relatively high voltage may be used to determine the signal-level of the cell. This method of reading the signal-level of a cell 112 may be called a hard decision or hard-bit read of the cell 112. In other embodiments alternative methods of reading the signal-level of a cell 112, for example a soft decision or soft-bit read, may be used.

Figure 2:
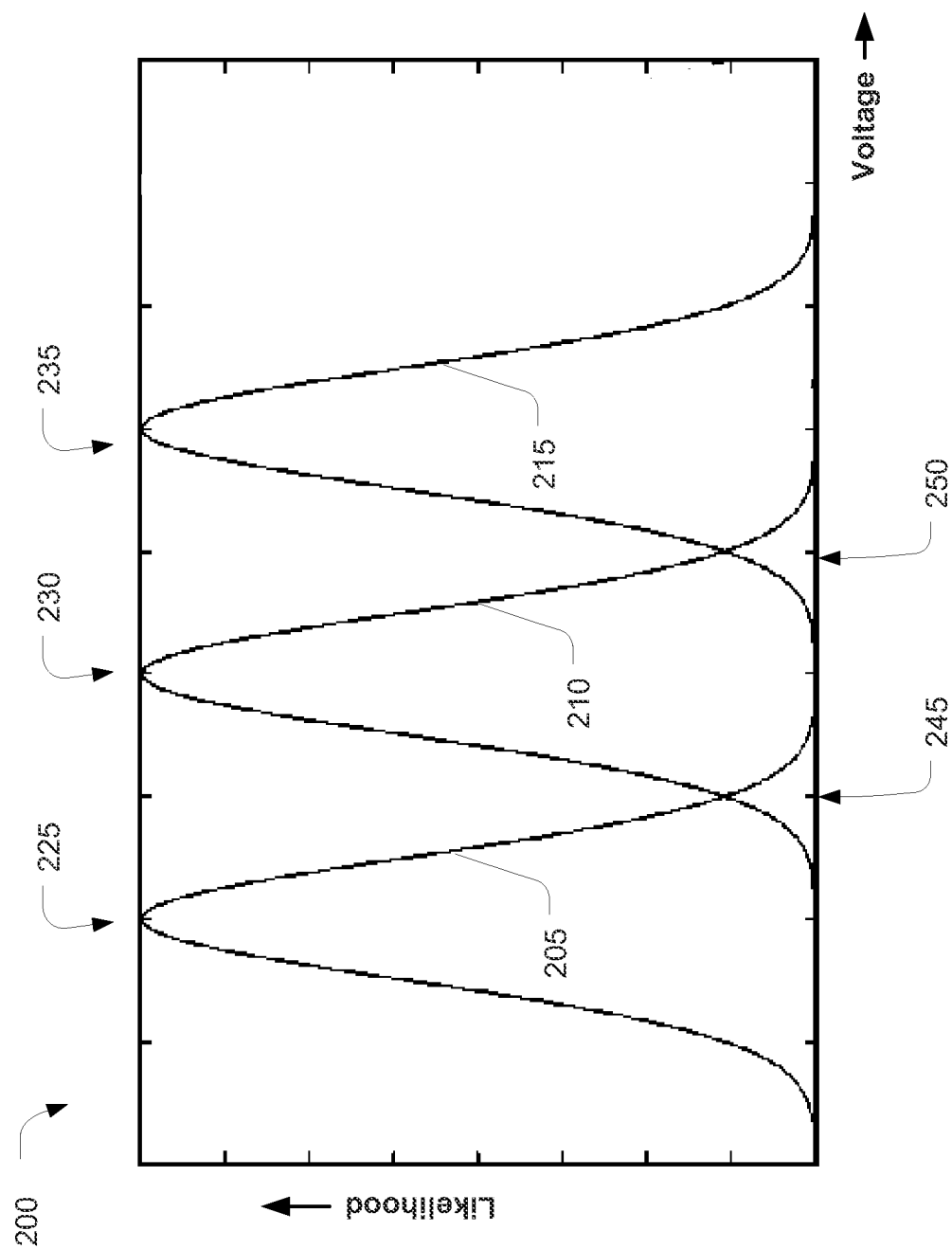
FIG. 2 illustrates example probability density functions (PDFs) for a MLC NVM cell, in accordance with various embodiments.

FIG. 2 shows an example 200 of a cell such as cell 112 which is able to store information at three possible signal-levels. Such a cell 112 may be called a three-signal-level cell. Specifically, shown in the example 200 are a graphic representation of probability density functions (PDFs) 205, 210, and 215 having respective peaks 225, 230, and 235 for the cell 112. The magnitude of a PDF may represent the likelihood that a cell 112 set to a signal-level will be set to a given voltage. In other words, each signal-level of the cell 112 may correspond to a PDF. In the displayed embodiment, PDF 205 may correspond to a signal-level of 0. PDF 210 may correspond to a signal-level of 1. PDF 215 may correspond to a signal-level of 2. In this example PDF 205 indicates that if the cell 112 is storing information at signal-level 0, then the cell 112 is most likely to be set to the voltage indicated by peak 225; however, the cell 112 may be set to a different voltage higher or lower than the peak 225 within PDF 205.

As described above, if the cell 112 is only capable of storing information at one of three signal-levels, then the signal-level of the cell 112 may not always be able to be represented in a data stream by a one-bit value. For example, the first signal-level may be able to be represented in the data stream by the one-bit value "0," and the second signal-level may be represented in the data stream by the one-bit value "1;" however, the one-bit value may not be able to represent the third signal-level in the data stream. Similarly, a two-bit value may not always be necessary and may create unnecessary overhead. In general, the theoretical optimum number of bits to represent three signal-levels may be $\log_2(3)=1.59$ bits. Hence, alternative representations for three-signal-level cells 112 may be desirable in some embodiments.

Still referring to FIG. 2, in one embodiment the reader 124 may perform a first read of the signal-level of a cell 112 at reference voltage 245 as described above. This read may be referred to as a "lower-page" read. If the lower-page read indicates that the voltage of the cell 112 is less than reference voltage 245, then it may be assumed that the cell 112 is set to signal-level 0. If the lower-page read indicates that the voltage of the cell 112 is higher than the reference voltage 245, then it may be assumed that the cell 112 is set to signal-level 1 or 2.

The reader 124 may then perform a second read of the signal-level of the cell 112 at reference voltage 250. This read may be referred to as an "upper-page" read. If the upper-page read indicates that the voltage of the cell 112 is less than reference voltage 250, then it may be assumed that the cell 112 is set to signal-level 1. If the upper-page read indicates that the voltage of the cell 112 is higher than the reference voltage 250, then it may be assumed that the cell 112 is set to signal-level 2.

As described above, consistently using a one-bit or a two-bit value to represent the signal-level of the cell 112 in a data stream may be disadvantageous. However, in some embodiments a one-bit value may be used for one signal-level of the cell 112, while a two-bit value may be used for another signal-level of the cell 112. For example, the one-bit value "1" may be used to represent that the cell 112 is set to signal-level "0." The two-bit value "00" may be used to represent that the cell 112 is set to signal-level "1." Finally, the two-bit value "01" may be used to represent that the cell 112 is set to signal-level "2," as described in further detail below.

Figure 3:
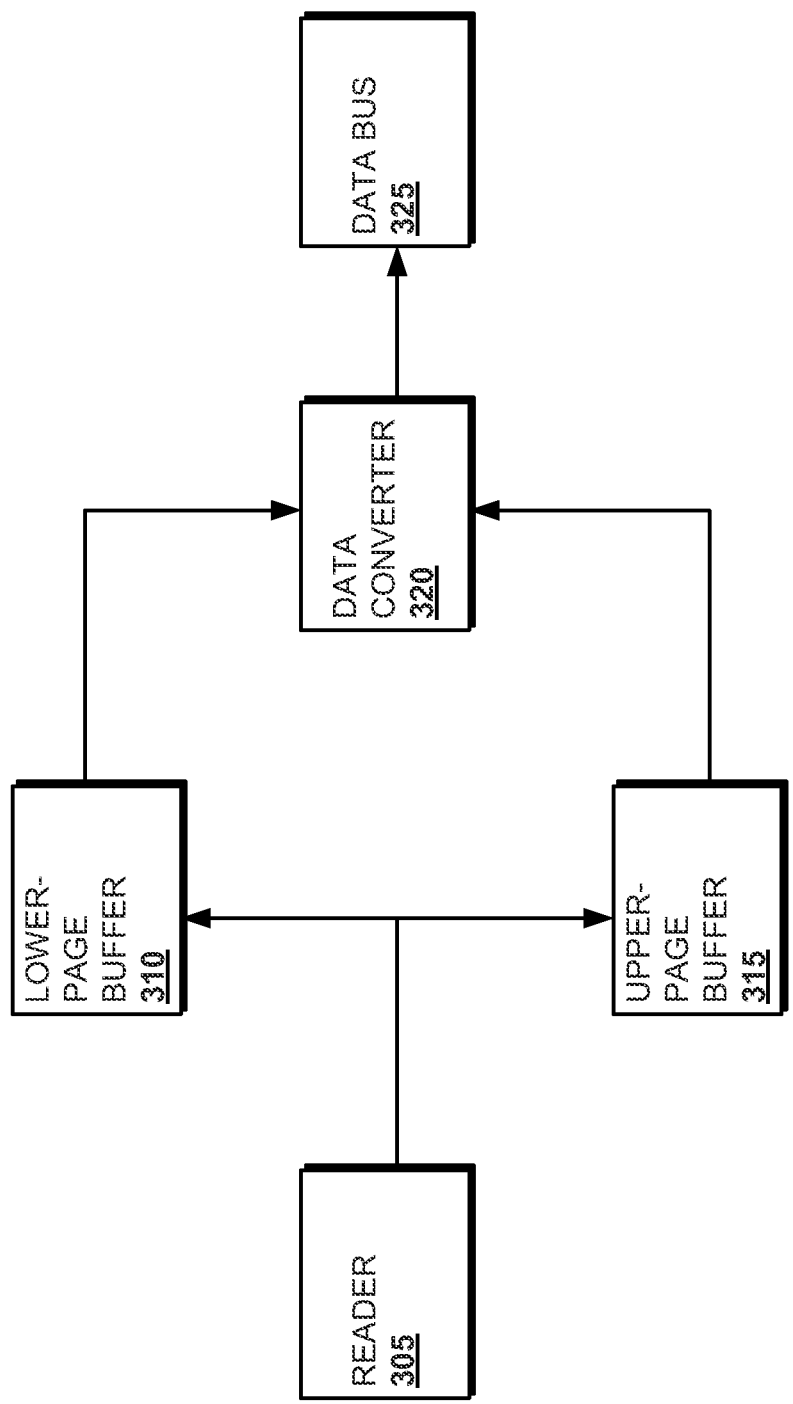
FIG. 3 illustrates an example data buffering and gating structure, in accordance with various embodiments.

FIG. 3 illustrates an example block diagram of a structure that may be used to represent the different signal-levels using both one-bit and two-bit values. In this embodiment, the lower-page and the upper-page reads may be performed for a plurality of cells such as cell 112. In some embodiments, the lower-page and the upper-page reads may be performed by a reader 305. In some embodiments the reader 305 may be the reader 124 described above. The results of the lower-page reads may be stored in a lower-page buffer 310, while the results of the upper-page read may be stored in an upper-page buffer 315. In some embodiments the lower-page buffer 310 may be a secondary data controller while the upper page-buffer 315 may be a primary data controller. The data of the lower-page buffer 310 and upper-page buffer 315 may be combined and transmitted by a data converter 320. In embodiments, the data converter 320 may be the conversion/compression module 116 described above with respect to FIG. 1. The data converter 320 may compress and/or convert the parallel reads of the cells 112 of a die 108, and output the data as a serial stream over a data bus 325 such as communication lines 120 described above with respect to FIG. 1. In some embodiments, the data of the upper-page buffer 315 may be gated dependent on a value in the lower-page buffer 310, as described in greater detail below.

Figure 4:
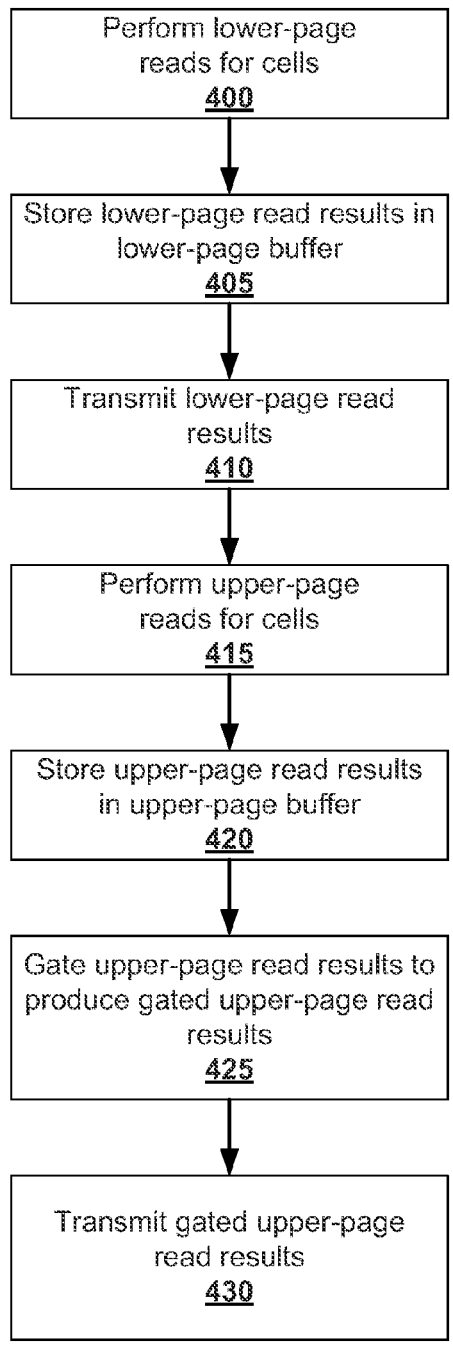
FIG. 4 illustrates an example process for gating and transmitting read results of cells of MLC NVM, in accordance with various embodiments.

FIG. 4 describes the process that a data converter 320 may use for gating the values of the upper-page buffer 315 in greater detail. As a first step, the lower-page reads for a plurality of cells 112 may be performed at 400. As described above, the lower-page reads may be performed by a reader such as reader 305. Specifically, for each cell 112, the signal-level of the cell 112 may be read with respect to reference voltage 245 shown in FIG. 2. If the voltage of the cell 112 is less than reference voltage 245, i.e. the cell 112 is set to signal-level 0, then the lower-page read result of the cell 112 may be "1." If the voltage of the cell 112 is greater than reference voltage 245, i.e. the cell is set to signal-levels 1 or 2, then the lower-page read result of the cell 112 may be "0." As used herein, the lower-page read result of a cell may be understood to be the value used to represent the result of the lower-page read of the cell in a data stream. Similarly, the upper-page read result of a cell may be understood to be the value used to represent the result of the upper-page read of the cell in a data stream.

The lower-page read results for each cell may be stored in a lower-page buffer such as lower-page buffer 310 at 405. In some embodiments, the lower-page buffer 310 may be configured to store 32 values, corresponding to parallel read results of 32 cells. In other embodiments the lower-page buffer 310 may be configured to store a greater or lesser number of values. The lower-page read results may then be transmitted at 410 in a data stream from the lower-page buffer 310 to a data converter such as data converter 320 which is configured to convert the read results output from the lower-page buffer 310 into serial data which may be transmitted on the data bus 325. In some embodiments the data converter 320 may be a parallel to serial converter configured to output variable rate serial data. The lower-page read results may be transmitted from the lower-page buffer 310 to the data converter when the lower-page buffer 310 is full, or as a result of some other trigger.

The upper-page reads for the cells 112 may then be performed at 415, for example by reader 305. Specifically, the voltage of each cell 112 may be compared to reference voltage 250. If the voltage of the cell 112 is less than reference voltage 250, i.e. the cell 112 is set to signal-levels 0 or 1, then the upper-page read result of the cell 112 may be "1." If the voltage of the cell 112 is greater than reference voltage 250, i.e. the cell 112 is set to signal-level 2, then the upper-page read result of the cell 112 may be "0."

The upper-page read results for the cells 112 may then be stored in an upper-page buffer, for example upper-page buffer 315 at 420. As described above with respect to the lower-page buffer 310, the upper-page buffer 315 may be configured to store 32 values corresponding to parallel reads of 32 cells 112 in one embodiment. In other embodiments, the upper-page buffer 315 may be configured to store a greater or lesser number of values.

The upper-page read results may then be gated to produce gated upper-page read results at 425, and then transmitted from the data converter 320 on the data bus 325 at 430. Specifically, the upper-page read results for each cell may be gated based at least partially on the lower-page read results for that cell. In some embodiments, the gating may be performed by the upper-page buffer 315, the data converter 320, or some other component of the computer system.

In one embodiment, the gating may comprise determining the lower-page read result of a given cell 112. If the lower-page read result of the cell 112 indicates that the cell 112 is set to signal-level 0, then the upper-page read result of the cell 112 may not be transmitted at 430. However, if the lower-page read result of the cell 112 indicates that the cell 112 is set to signal-levels 1 or 2, then the upper-page read result of the cell 112 may be transmitted at 430.

Figure 5:
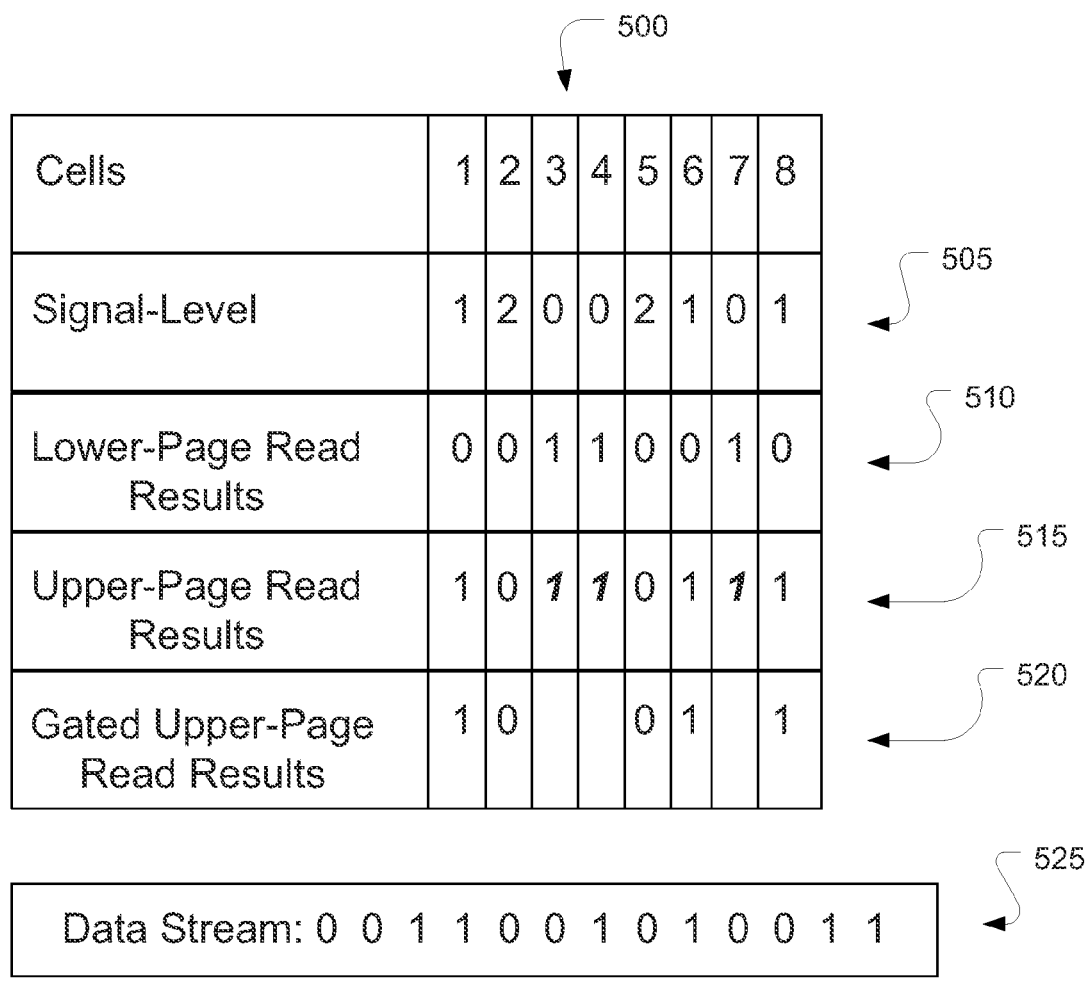
FIG. 5 illustrates an example data gating result, in accordance with various embodiments.

FIG. 5 provides a specific example of how the gating may be performed in one embodiment. With respect to FIG. 5, the signal-levels 505, lower-page read results 510, and upper-page read results 515 are intended to correspond to one another vertically in table 500. Therefore, the signal-level 505 "1," lower-page read result 510 "0," and upper-page read result 515 "1," may all correspond to the first cell 112 in table 500. Similarly, signal-level 505 "2," lower-page read result 510 "0," and upper-page read result "0" may all correspond to the fifth cell 112 in table 500.

In this embodiment, assume that there are eight cells [1, 2, 3, 4, 5, 6, 7, 8] with respective signal-levels 505 of [1, 2, 0, 0, 2, 1, 0, 1]. The lower-page reads of each cell 112 may be performed to produce lower-page read results 510 of [0, 0, 1, 1, 0, 0, 1, 0]. Specifically, as described above, if the signal-level 505 of a cell 112 is "0," then the lower-page read result 510 of that cell 112 may be "1." However, if the signal-level 505 of the cell 112 is "1" or "2," then the lower-page read result 510 of that cell 112 may be "0."

The upper-page reads may then be performed for each cell 112 at 420 to produce upper-page read results of [1, 0, 1, 1, 0, 1, 1, 1]. Specifically, as described above, if the signal-level 505 of a cell 112 is "1," then the upper-page read result 515 of the cell 112 may be "1." If the signal-level 505 of a cell 112 is "2," then the upper-page read result 515 of the cell 112 may be "0." As described above with reference to 415, the upper-page read may be performed against reference voltage 250. Therefore, if the signal-level 505 of the cell 112 is "0," then the upper-page read result 515 of the cell 112 may also be represented as a "1," as shown by the bolded/italicized "1"s in the upper-page read results 515 of FIG. 5. In other embodiments, signal-level "0" may be represented by some other value in upper-page read results 515.

When the upper-page read results 515 are gated at 425, the upper-page read results 515 that correspond to a signal-level "0," may not be transmitted. In other words, the lower-page read result 510 of each cell 112 may be analyzed. If the lower-page read result 510 for a given cell 112 is equal to "1," then the upper-page read result 515 may not be transmitted. In the example shown in FIG. 5, the three bolded/italicized "1"s that correspond to cells 3, 4, and 7 may be removed because the signal-levels 505 of those cells are "0" and the lower-page read results 510 of those cells 112 are "1." This gating may produce the gated upper-page read results 520 shown in table 500.

The data stream 525 that is transmitted by the data converter 320 at 410 and 430 may then be comprised of the lower-page read results 510 and the gated upper-page read results 520. Specifically, the first eight values of the data stream 525 may be comprised of the lower-page read results 510 [0 0 1 1 0 0 1 0]. The remaining five values of the data stream 525 may be comprised of the gated upper-page read results 520 [1 0 0 1 1].

Figure 6:
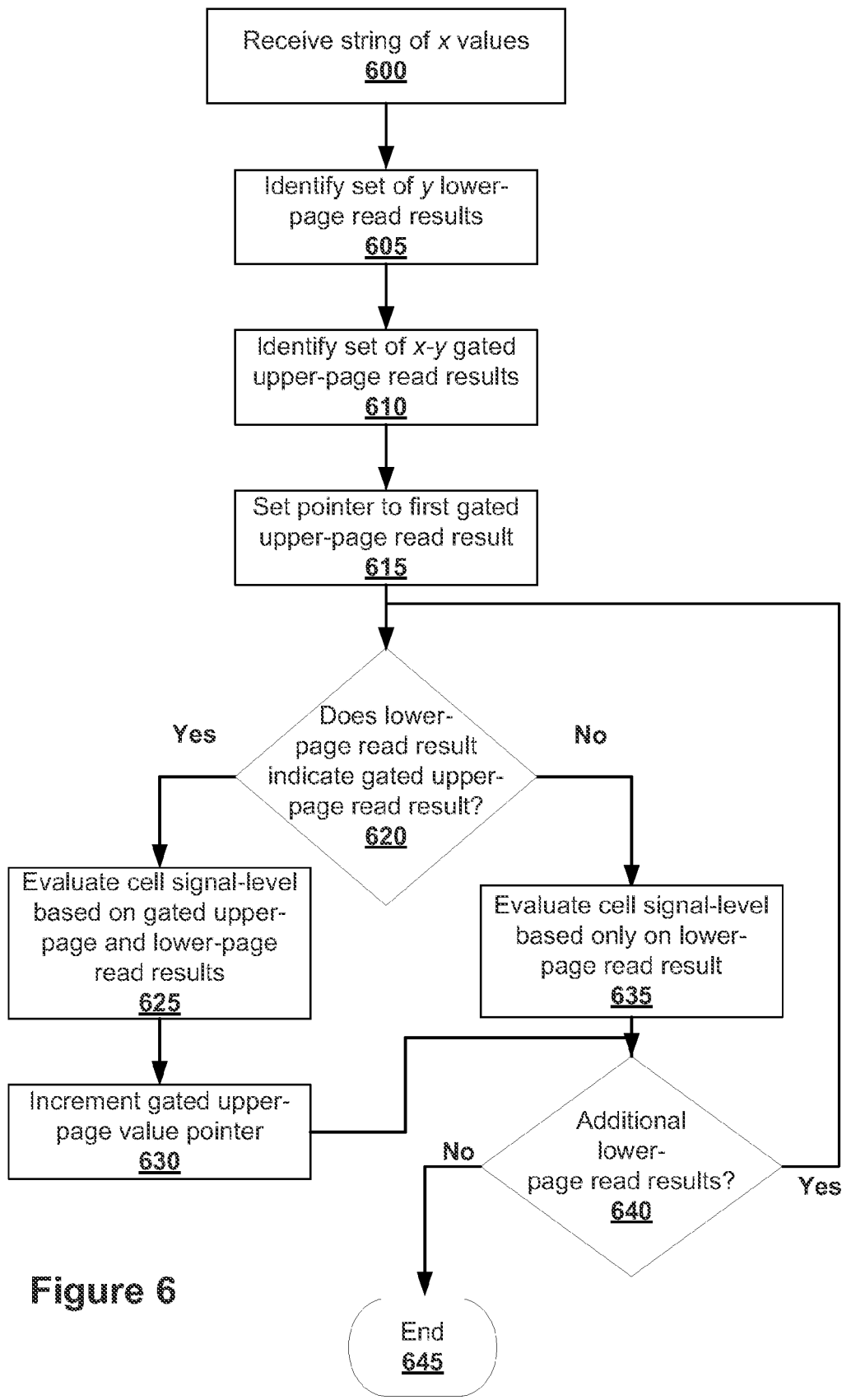
FIG. 6 illustrates an example process for receiving a data stream containing read results of cells of MLC NVM, in accordance with various embodiments.

FIG. 6 depicts how a data stream such as data stream 525 may be decoded by an entity receiving the data stream, for example controller 110 described above. A receiver may receive a string of x values at 600. X may be a combination of the lower-page read results 510 and the gated upper-page read results 520, as shown with respect to data stream 525. In the example shown in FIG. 5, x may be equal to "13."

Next, the receiver may identify a set of y values comprising the lower-page read results 510 at 605 from the x values received at 600. In some embodiments, y may already be a known quantity. For example, the receiver may know ahead of time how many lower-page read results 510 will be received. Alternatively, the receiver may receive an indication of y with the data stream 525. In the example shown in FIG. 5, y may be equal to "8."

After determining the number of lower-page read results at 605, the receiver may identify the number of x-y gated upper-page read results 520 at 610. Specifically, after identifying the number of lower-page read results 510 in the data stream 525, the remainder of the data stream 525 may be the gated upper-page read results 520. After the receiver identifies the gated upper-page read results 520, the receiver may set a pointer to the first value in the gated upper-page read results 520 at 615.

The receiver may then proceed to evaluate the lower-page read results 510 at 620. Specifically, the receiver may determine whether the lower-page read result 510 for a cell 112 indicates that one of the gated upper-page read results 520 are necessary to determine a signal-level for the cell 112. For example, with respect to the embodiment in FIG. 5, if the lower-page read result 510 of a cell 112 is equal to "0," then the receiver may determine that the cell 112 is set to signal-level "1" or "2." Therefore, the signal-level of the cell 112 may be represented in the data stream by a two-bit value and both the lower-page read result 510 and the gated upper-page read result 520 may be necessary to determine the signal-level of the cell 112. Therefore, the receiver may evaluate the cell signal-level based on the lower-page read result 510 and the gated upper-page read result 520 for the cell 112 at 625. In the example shown in FIG. 5, the receiver may therefore determine that the signal-level of the cell is represented by the lower-page read result 510 "0" and the gated upper-page read result 520 "1," and therefore the signal-level of the first cell 112 is "1." The receiver may then increment the gated upper-page read result pointer at 630. Therefore, if additional lower-page read results 510 remain in the data stream 525 at 640, and the lower-page read result 510 for a next cell 112 indicates that a gated upper-page read result 520 is necessary, the receiver will be able to determine the next gated upper-page read result 520 to use. For example, the pointer may indicate to the receiver that the receiver should use the third gated upper-page read result 520 for the fifth cell as shown in FIG. 5.

If the receiver determines that a gated upper-page read result 520 is not necessary at 620, then the receiver may determine the signal-level of the cell 112 based solely on the lower-page read result 510 at 635. The receiver may then proceed to determine whether there are additional lower-page read results 510 in the data stream 525 at 640. If there are no remaining lower-page read results 510 in the data stream 525, then the process may end at 645.

Although FIG. 4 describes the operations in a specific order where the storage 405 and transmission 410 of the lower-page read results occurs before performing the upper-page read at 415, in some embodiments the lower-page read at 400 and the upper-page read at 415 for a given cell 112 or cells 112 may occur one after the other and before any buffering or transmission. Additionally, the specific read results given above are example and in other embodiments a different signal-level may be represented by a single value. In some embodiments the values of "0" or "1" may be switched, or other values may be used. In some embodiments, the above described process may be extrapolated to cells with additional signal-levels. In these embodiments, the read results may be single-bit, multi-bit, or some combination thereof. Finally, the number of values in the lower-page read results 510, upper-page read results 515, gated upper-page read results 520, and data stream 525 are merely example. Although only eight cells are depicted in FIG. 5 and discussed in FIGS. 5 and 6, in other embodiments more or less cells such as 16 cells, 32 cells, or some other number of cells may be evaluated and transmitted together in the data stream 525.

The above described process offers significant advantages. Specifically, because the data representation of the signal-levels of a plurality of cells may be dynamically changed between a one-bit representation and a two-bit representation in a data stream, the amount of data required to transmit the signal-levels of the cells may be shortened. In some embodiments, the average amount of data used in the data stream 525 to represent the signal-level of a cell 112 may be on the order of 1.625 bits per signal-level. The 1.625 bits per signal level may lead to compression of the data stream 525 by as much as 18.75% over other methods. This compression may also reduce the amount of time required to encode or decode a NVM 104. In some embodiments, the above described processes may be expanded to other MLC NVM with signal levels that may not be efficiently represented in a binary format. For example, the above described processes may be applied to MLC NVM with five, six, or some other number of signal levels. In general, the above described processes may be generalized to MLC NVM where the number of signal levels of the MLC NVM is less than n*2 where n is the minimum number of bits necessary to represent the highest signal level.

Figure 7:
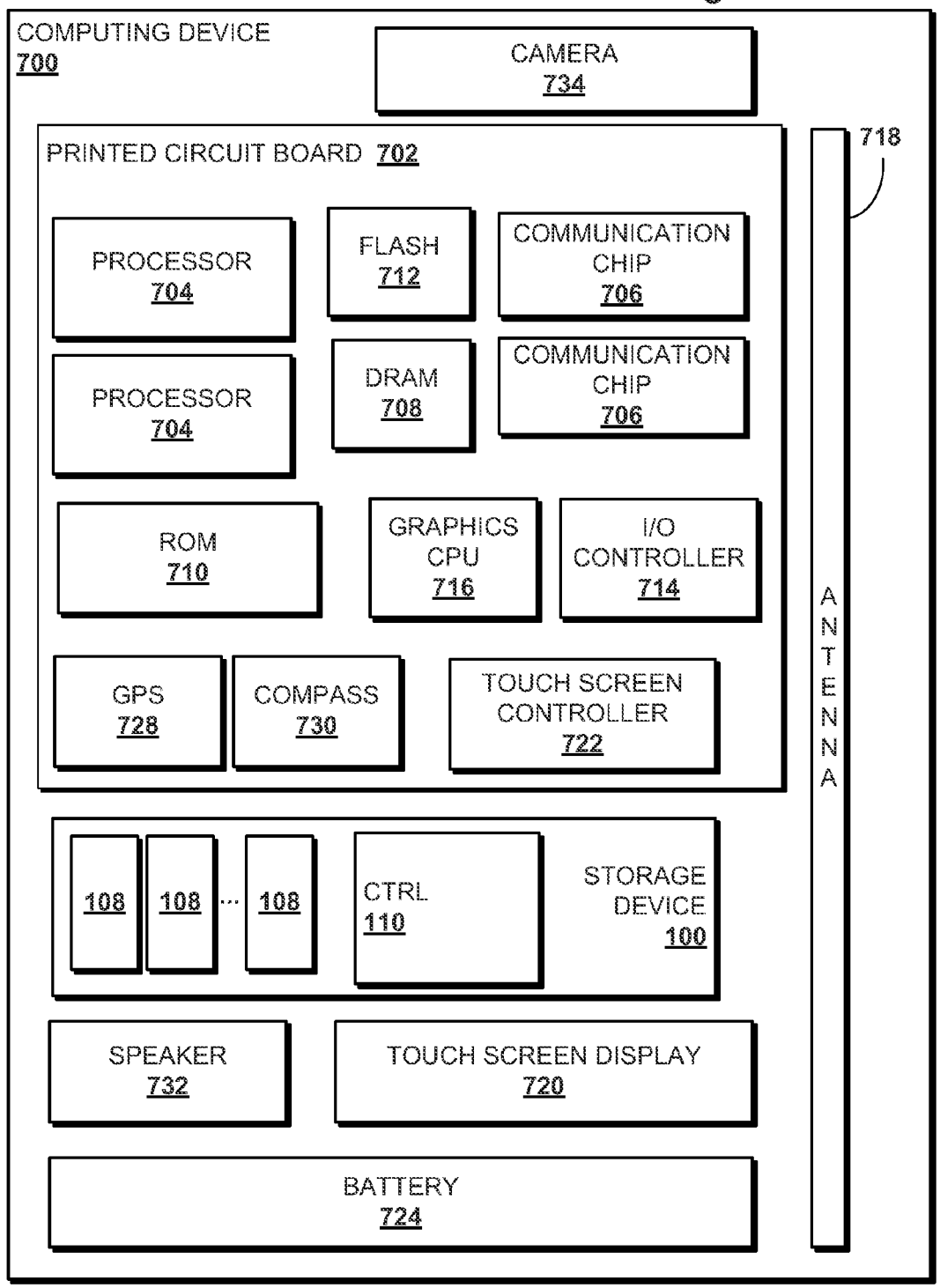
FIG. 7 illustrates an example system configured to perform the methods described herein, in accordance with various embodiments.

FIG. 7 illustrates an example computing device 700 in which systems such as storage device 100 may be incorporated, in accordance with various embodiments. Computing device 700 may include a number of components, one or more processor(s) 704 and at least one communication chip 706. In various embodiments, the one or more processor(s) 704 each may include one or more processor cores. In various embodiments, the at least one communication chip 706 may be physically and electrically coupled to the one or more processor(s) 704. In further implementations, the communication chip 706 may be part of the one or more processor(s) 704. In various embodiments, computing device 700 may include PCB 702. For these embodiments, the one or more processor(s) 704 and communication chip 706 may be disposed thereon. In alternate embodiments, the various components may be coupled without the employment of PCB 702.

Depending on its applications, computing device 700 may include other components that may or may not be physically and electrically coupled to the PCB 702. These other components include, but are not limited to, volatile memory (e.g., DRAM 708), non-volatile memory such as read only memory 710 (ROM) and storage device 100 (which may include die 108 and controller 110 as described earlier), an I/O controller 714, a digital signal processor (not shown), a crypto processor (not shown), a graphics processor 716, one or more antenna 718, a display (not shown), a touch screen display 720, a touch screen controller 722, a battery 724, an audio codec (not shown), a video codec (not shown), a global positioning system (GPS) device 728, a compass 730, an accelerometer (not shown), a gyroscope (not shown), a speaker 732, a camera 734, and a mass storage device (such as hard disk drive, a solid state drive, compact disk (CD), digital versatile disk (DVD))(not shown), and so forth. In various embodiments, the processor 704 may be integrated on the same die with other components to form a System on Chip (SoC).

In various embodiments, rather than or in addition to storage device 100, computing device 700 may include resident non-volatile memory, e.g., flash memory 712. In some embodiments, the one or more processor(s) 704 and/or flash 712 may include associated firmware (not shown) storing programming instructions configured to enable computing device 700, in response to execution of the programming instructions by one or more processor(s) 704 to practice all or selected aspects of the blocks described above with respect to FIG. 4 or 6. In various embodiments, these aspects may additionally or alternatively be implemented using hardware separate from the one or more processor(s) 704 or flash memory 712.

The communication chips 706 may enable wired and/or wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

In various implementations, the computing device 700 may be a laptop, a netbook, a notebook, an ultrabook, a smartphone, a computing tablet, a personal digital assistant (PDA), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 700 may be any other electronic device that processes data.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

EXAMPLES

Example 1 is method to read memory comprising: performing, by a computing device, a lower-page read of a plurality of cells in a multi-level non-volatile memory, the plurality of cells respectively configured to store a data at one of a plurality of signal-levels, to produce lower-page read results; storing, by the computing device, the lower-page read results in a lower-page buffer; performing, by the computing device an upper-page read of the plurality of cells to produce upper-page read results corresponding to the lower-page read results; storing, by the computing device, the upper-page read results in an upper-page buffer; and transmitting the lower-page read results and gated upper-page read results, wherein a transmission of the upper-page read results is gated based at least in part on the lower-page read results to produce the gated upper-page read results.

Example 2 may include the subject matter of Example 1, and further specifies that a first signal-level of a cell is represented only by a value of the lower-page read results, and a second signal-level of the cell is represented by a value of the lower-page read results and a value of the gated upper-page read results.

Example 3 may include the subject matter of Example 1, and further specifies that the gated upper-page read results include a value of the upper-page read results if a corresponding value of the lower-page read results is a first value, and the gated upper-page read results lack a value of the upper-page read results if a corresponding value of the lower-page read results is a second value.

Example 4 may include the subject matter of Example 3, and further specifies that the first value is equal to 0 and the second value is equal to 1.

Example 5 may include the subject matter of any of Examples 1-4, and further specifies that the lower-page read results and the upper-page read results have a same length, and the lower-page read results and the gated upper-page read results are of different lengths.

Example 6 may include the subject matter of any of Examples 1-4, and further includes transmitting the lower-page read results before the gated upper-page read results.

Example 7 may include the subject matter of any of Examples 1-4, and further specifies that the computing device includes a microprocessor comprising a controller having an encoder and a decoder, and a number of processor cores coupled with the controller; a solid state drive coupled with the microprocessor, the solid state drive comprising the non-volatile memory; and a battery coupled with the controller.

Example 8 is one or more machine readable media including instructions that, in response to execution by a computing device, cause the computing device to perform the method of any of Examples 1-7.

Example 9 is an apparatus including a plurality of processing cores and one or more machine readable media including instructions that, in response to execution by the plurality of processing cores, cause the apparatus to perform the method of any of Examples 1-7.

Example 10 is an apparatus including logic for performing the operations of the method of any of Examples 1-7.

Example 11 is an apparatus including one or more means for performing the operations of the method of any of Examples 1-7.

Example 12 may include a method of reading memory comprising: receiving, by a computing device, a serial string of values generated based on outputs of a plurality of cells in a multi-level non-volatile memory, wherein an output of a cell in the plurality of cells is based at least in part on the signal level of the cell; identifying, by the computing device, a first set of values in the serial string of values, the first set of values comprising results of a lower-page read of the plurality of cells using a first reference signal; identifying, by the computing device, a second set of values in the serial string of values based at least in part on the first set of values, the second set of values comprising results of an upper-page read of the plurality of cells using the a second reference signal; and identifying, by the computing device, a signal-level of a first cell in the plurality of cells based only on the first set of values, and identify a signal-level of a second cell in the plurality of cells based on the first set of values and the second set of values.

Example 13 may include the subject matter of Example 12, and further includes receiving, by the computing device, an indication of a length of the first set of values; and identifying, by the computing device, the second set of values based at least in part on the length of the first set of values.

Example 14 may include the subject matter of Example 12, and further including identifying, by the computing device, the signal-level of the first cell based only on the first set of values if a value in the first set of values is equal to 1; and identifying, by the computing device, the signal-level of the second cell based on the first set of values and the second set of values if the value in the first set of values is equal to 0.

Example 15 may include the subject matter of Example 14, and further including identifying, by the computing device, the signal-level of the second cell based on the first set of values and the second set of values using a pointer to the second set of values, wherein the pointer is incremented each time a value is read from the second set of values.

Example 16 may include the subject matter of any of Examples 12-15, and further specifying that the second reference signal is at a voltage higher than a voltage of the first reference signal.

Example 17 may include the subject matter of any of Examples 12-15, and further including receiving, by the computing device, the serial string of values from one or more buffers.

Example 18 may include the subject matter of any of Examples 12-15, and further specifying that the computing device is a three-dimensional (3D) cross point memory.

Example 19 may include the subject matter of any of Examples 12-15, and further specifying that the computing device is a solid state drive or a hybrid hard disk drive.

Example 20 may include the subject matter of any of Examples 12-15, and further specifying that the computing device is a personal digital assistant (PDA), a smartphone, a computing tablet, an e-reader, an ultrabook, a laptop computer, a desktop computer, a server, a set-top box, or a game console.

Example 21 may include one or more machine readable media including instructions that, in response to execution by a computing device, cause the computing device to perform the method of any of Examples 12-20.

Example 22 is an apparatus including a plurality of processing cores and one or more machine readable media including instructions that, in response to execution by the plurality of processing cores, cause the apparatus to perform the method of any of Examples 12-20.

Example 23 is an apparatus including logic for performing the operations of the method of any of Examples 12-20.

Example 24 is an apparatus including one or more means for performing the operations of the method of any of Examples 12-20.

What is claimed is:

1. An apparatus comprising:
 a plurality of cells in a multi-level non-volatile memory, the plurality of cells respectively configured to store a data at one of a plurality of signal-levels; and
 a reader configured to:
  perform a lower-page read of the plurality of cells to produce lower-page read results;
  store the lower-page read results in a lower-page buffer;
  perform an upper-page read of the plurality of cells to produce upper-page read results corresponding to the lower-page read results; and store the upper-page read results in an upper-page buffer; and a conversion/compression module configured to transmit the lower-page read results and gated upper-page read results, wherein a transmission of the upper-page read results is gated based at least in part on the lower-page read results to produce the gated upper-page read results.

2. The apparatus of claim 1, wherein a first signal-level of a cell is represented only by a value of the lower-page read results, and a second signal-level of the cell is represented by a value of the lower-page read results and a value of the gated upper-page read results.

3. The apparatus of claim 1, wherein the gated upper-page read results include a value of the upper-page read results if a corresponding value of the lower-page read results is a first value, and the gated upper-page read results lack a value of the upper-page read results if a corresponding value of the lower-page read results is a second value.

4. The apparatus of claim 3, wherein the first value is equal to 0 and the second value is equal to 1.

5. The apparatus of claim 1, wherein the lower-page read results and the upper-page read results have a same length, and the lower-page read results and the gated upper-page read results are of different lengths.

6. The apparatus of claim 1, wherein the conversion/compression module is further caused to transmit the lower-page read results before the gated upper-page read results.

7. The apparatus of claim 1, wherein the apparatus is a computing device including a microprocessor comprising a controller having an encoder and a decoder, and a number of processor cores coupled with the controller;
a solid state drive coupled with the microprocessor, the solid state drive comprising the non-volatile memory; and
a battery coupled with the controller.

8. One or more computer readable media comprising instructions configured to, in response to execution of the instructions by the device, cause the device to:
receive a serial string of values generated based on outputs of a plurality of cells in a multi-level non-volatile memory, wherein an output of a cell in the plurality of cells is based at least in part on the signal level of the cell;
identify a first set of values in the serial string of values, the first set of values comprising results of a lower-page read of the plurality of cells using a first reference signal;
identify a second set of values in the serial string of values based at least in part on the first set of values, the second set of values comprising results of an upper-page read of the plurality of cells using the a second reference signal; and
identify a signal-level of a first cell in the plurality of cells based only on the first set of values, and identify a signal-level of a second cell in the plurality of cells based on the first set of values and the second set of values.

9. The one or more computer readable media of claim 8, wherein the instructions are further configured to, in response to execution of the instructions by the device, cause the device to receive an indication of a length of the first set of values; and
identify the second set of values based at least in part on the length of the first set of values.

10. The one or more computer readable media of claim 8, wherein the instructions are further configured to, in response to execution of the instructions by the device, cause the device to identify the signal-level of the first cell based only on the first set of values if a value in the first set of values is equal to 1; and identify the signal-level of the second cell based on the first set of values and the second set of values if the value in the first set of values is equal to 0.

11. The one or more computer readable media of claim 10, wherein the instructions are further configured to, in response to execution of the instructions by the device, cause the device to identify the signal-level of the second cell based on the first set of values and the second set of values using a pointer to the second set of values, wherein the pointer is incremented each time a value is read from the second set of values.

12. The one or more computer readable media of claim 8, wherein the second reference signal is at a voltage higher than a voltage of the first reference signal.

13. The one or more computer readable media of claim 8, wherein the receiver is configured to receive the serial string of values from one or more buffers of the device.

14. The one or more computer readable media of claim 8, wherein the device is a three-dimensional (3D) cross point memory.

15. The one or more computer readable media of claim 8, wherein the device is a solid state drive or a hybrid hard disk drive.

16. The one or more computer readable media of claim 8, wherein the device is disposed in an apparatus selected from a personal digital assistant (PDA), a smartphone, a computing tablet, an e-reader, an ultrabook, a laptop computer, a desktop computer, a server, a set-top box, or a game console.

17. A method of reading a value of a plurality of cells in a multi-level non-volatile memory comprising:
performing, by a computing device, a lower-page read of the plurality of cells in the multi-level non-volatile memory to produce lower-page read results;
storing, by the computing device, the lower-page read results in a lower-page buffer;
performing, by the computing device, an upper-page read of the plurality of cells in the multi-level non-volatile memory to produce upper-page read results;
storing, by the computing device, the upper-page read results in an upper-page buffer;
gating, by the computing device, the upper-page read results based at least in part on the lower-page read results to produce gated upper-page read results; and
transmitting, by the computing device, the lower-page read results and the gated upper-page read results.

18. The method of claim 17, further comprising:
representing, by the computing device, a value of a first signal-level in the multi-level non-volatile memory as a single value in the lower-page read results; and
representing, by the computing device, a value of a second signal-level in the multi-level non-volatile memory as a combination of a value in the lower-page read results and a value in the gated upper-page read results.

19. The method of claim 17, wherein gating the upper-page read results comprises including, by the computing device, a value of the upper-page read results in the gated upper-page read results if a corresponding value of the lower-page read results is a first value, and removing, by the computing device, a value of the upper-page read results from the gated upper-page read results if a corresponding value of the lower-page read results is a second value.

20. The method of claim 17, wherein transmitting comprises transmitting, by the computing device, the lower-page read results before the gated upper-page read results.

* * * * *